(12) United States Patent
Dong et al.

(10) Patent No.: US 11,355,543 B2
(45) Date of Patent: Jun. 7, 2022

(54) PACKAGING UNIT, COMPONENT PACKAGING STRUCTURE AND PREPARATION METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Tingze Dong, Beijing (CN); Yan Yang, Beijing (CN); Hailong Zhou, Beijing (CN); Xian Li, Beijing (CN); Limin Tian, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 868 days.

(21) Appl. No.: 16/089,428

(22) PCT Filed: Mar. 28, 2018

(86) PCT No.: PCT/CN2018/080901
§ 371 (c)(1),
(2) Date: Sep. 28, 2018

(87) PCT Pub. No.: WO2018/210065
PCT Pub. Date: Nov. 22, 2018

(65) Prior Publication Data
US 2021/0273001 A1    Sep. 2, 2021

(30) Foreign Application Priority Data
May 17, 2017    (CN) .......................... 201710349242.5

(51) Int. Cl.
*H01L 27/146* (2006.01)
*H01L 23/544* (2006.01)

(52) U.S. Cl.
CPC ...... *H01L 27/14634* (2013.01); *H01L 23/544* (2013.01); *H01L 27/1469* (2013.01);
(Continued)

(58) Field of Classification Search
CPC ......... H01L 27/14687; H01L 27/14632; H01L 27/14634; H01L 27/1469; H01L 27/14618;
(Continued)

(56) References Cited

U.S. PATENT DOCUMENTS

| 4,725,517 A | * | 2/1988 | Nakanowatari ... G02F 1/133711 349/124 |
| 2003/0112404 A1 | * | 6/2003 | Kim ...................... G02F 1/1339 349/153 |

(Continued)

FOREIGN PATENT DOCUMENTS

| CN | 102270585 A | 12/2011 |
| CN | 103681482 A | 3/2014 |

(Continued)

OTHER PUBLICATIONS

Search Report and Written Opinion for International Application No. PCT/CN2018/080901 dated Jun. 27, 2018.
(Continued)

*Primary Examiner* — Bilkis Jahan
*Assistant Examiner* — Victor V Barzykin
(74) *Attorney, Agent, or Firm* — Calfee, Halter & Griswold LLP

(57) ABSTRACT

A packaging unit, a component packaging structure and a preparation method thereof. The packaging unit includes a bonding substrate and spacers formed on the bonding sub-
(Continued)

strate through a patterning process, wherein the bonding substrate is reserved with packaging regions for applying sealant. When the packaging unit is used to package a component, because the spacer(s) is supported between the bonding substrate and the base substrate, the packaging unit is easy to separate from the base substrate At the same time, the packaging unit has little or no damage to the base substrate and elements formed on the base substrate, thus effectively protecting the performance of the base substrate and the elements on the base substrate.

9 Claims, 2 Drawing Sheets

(52) U.S. Cl.
CPC .. *H01L 27/14618* (2013.01); *H01L 27/14632* (2013.01); *H01L 27/14687* (2013.01); *H01L 27/14698* (2013.01); *H01L 2223/54426* (2013.01)

(58) Field of Classification Search
CPC ............. H01L 27/14698; H01L 23/544; H01L 2223/54426
See application file for complete search history.

(56) References Cited

U.S. PATENT DOCUMENTS

| | | | |
|---|---|---|---|
| 2003/0117569 A1* | 6/2003 | Kim | G02F 1/1339 349/153 |
| 2003/0147040 A1* | 8/2003 | Park | G02F 1/1339 349/187 |
| 2007/0126075 A1* | 6/2007 | Hsu | H01L 27/14683 257/433 |
| 2007/0182912 A1* | 8/2007 | Kobayashi | G02F 1/13394 349/153 |
| 2012/0326201 A1 | 12/2012 | Ohnuma et al. | |
| 2015/0115413 A1* | 4/2015 | Rudmann | H01L 27/14634 257/622 |
| 2015/0293279 A1* | 10/2015 | Pei | G02B 5/201 359/891 |
| 2016/0254491 A1 | 9/2016 | Wang et al. | |
| 2016/0266432 A1* | 9/2016 | Tamatani | G02F 1/1339 |
| 2017/0170423 A1 | 6/2017 | Sun | |

FOREIGN PATENT DOCUMENTS

| | | |
|---|---|---|
| CN | 104299981 A | 1/2015 |
| CN | 104465709 A | 3/2015 |
| CN | 107180843 A | 9/2017 |

OTHER PUBLICATIONS

First Office Action for Chinese Patent Application No. 201710349242.5 dated Mar. 18, 2019.

* cited by examiner

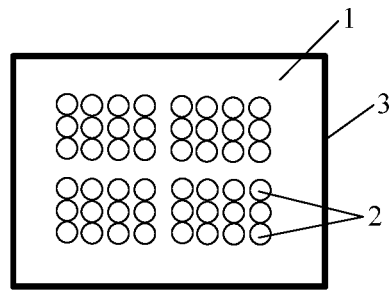
Fig.1
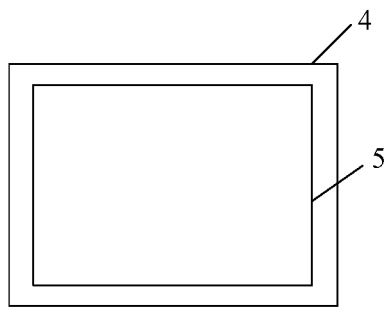
Fig.2
| Aligning a packaging unit with a component, wherein a bonding substrate of the packaging unit and a base substrate of the component are supported by at least one spacer | 101 |
↓
| Packaging the bonding substrate and the base substrate for assembly or transportation | 102 |
Fig.3

US 11,355,543 B2

PACKAGING UNIT, COMPONENT PACKAGING STRUCTURE AND PREPARATION METHOD THEREOF

RELATED APPLICATION

This application is the U.S. national phase entry of PCT/CN2018/080901, with an international filing date of Mar. 28, 2018, which claims priority to Chinese patent application No. 201710349242.5 filed on May 17, 2017, the entire content of which is incorporated herein by reference.

FIELD OF THE DISCLOSURE

The present disclosure relates to the technical field of display, in particular to a packaging unit, a component packaging structure and a preparation method thereof.

BACKGROUND OF THE DISCLOSURE

Optical sensor is a sensor using photoelectric effect, which is widely used because of its high precision, for example, in the medical field.

The optical sensor mainly includes a substrate and elements (mainly including at least one of optical elements, electrical elements and electronic elements), and the elements are usually arranged on one side of the substrate. Due to the high precision requirement of optical sensors, it is necessary to package the sensors in the process of storage and transportation before use so as not to damage the elements of the sensors.

Therefore, there is an urgent need for a packaging structure that is convenient to operate and has no damage or less damage to optical sensors, as well as its manufacturing process.

SUMMARY OF THE DISCLOSURE

In one exemplary embodiment, the present disclosure provides a packaging unit, including:
a bonding substrate,
at least one spacer formed on the bonding substrate through patterning process,
wherein the bonding substrate is reserved with packaging regions for applying sealant.

Further, the packaging unit further includes:
An alignment mark formed on the bonding substrate through a patterning process.

In another exemplary embodiment, the at least one spacer has a plurality, and heights of the spacers are the same or different.

Further, the spacer is a cylinder, cuboid, or cube.

In another exemplary embodiment, the present disclosure also provides a component packaging structure, wherein the component packaging structure includes a base substrate, a component arranged on the base substrate and the above described packaging unit, wherein the packaging unit and the component are aligned with each other.

The spacer is supported between a bonding substrate of the packaging unit and a base substrate of the component, the bonding substrate and the base substrate are packaged by applying sealant in the packaging region, and elements of the component are packaged between the bonding substrate and the base substrate.

In yet another exemplary embodiment, the present disclosure also provides a preparation method of the above described component packaging structure, which includes the following steps:

aligning the packaging unit with the component, wherein the bonding substrate of the packaging unit and the base substrate of the component are supported by spacer(s), and
packaging the bonding substrate and the base substrate for assembly or transportation.

Further, a plurality of components share a same base substrate, the method further including:
cutting the same base substrate to obtain a plurality of individual component packaging structures.

Further, the method further includes:
re-cutting each of the individual component packaging structures again, wherein the cutting line is positioned inwards of the packaging line of the individual component packaging structure,
separating cut packaging units to obtain the components for final use.

Further, separating the cut packaging units includes:
separating the cut packaging unit from the component using a suction ball or a bamboo stick.

Furthermore, the bonding substrate is provided with a first alignment mark and the base substrate is provided with a second alignment mark,
wherein aligning the packaging unit with the component includes:
aligning the first alignment mark of the bonding substrate and the second alignment mark of the base substrate, and
placing the packaging unit on the base substrate according to the determined aligned position.

BRIEF DESCRIPTION OF THE DRAWINGS

FIG. 1 is a schematic structural view of a packaging unit provided by an embodiment of the present disclosure.

FIG. 2 is a schematic structural view of a base substrate provided by an embodiment of the present disclosure.

FIG. 3 is a flowchart of a method for preparing a component packaging structure provided by an embodiment of the present disclosure.

DETAILED DESCRIPTION OF THE DISCLOSURE

Figure 4:
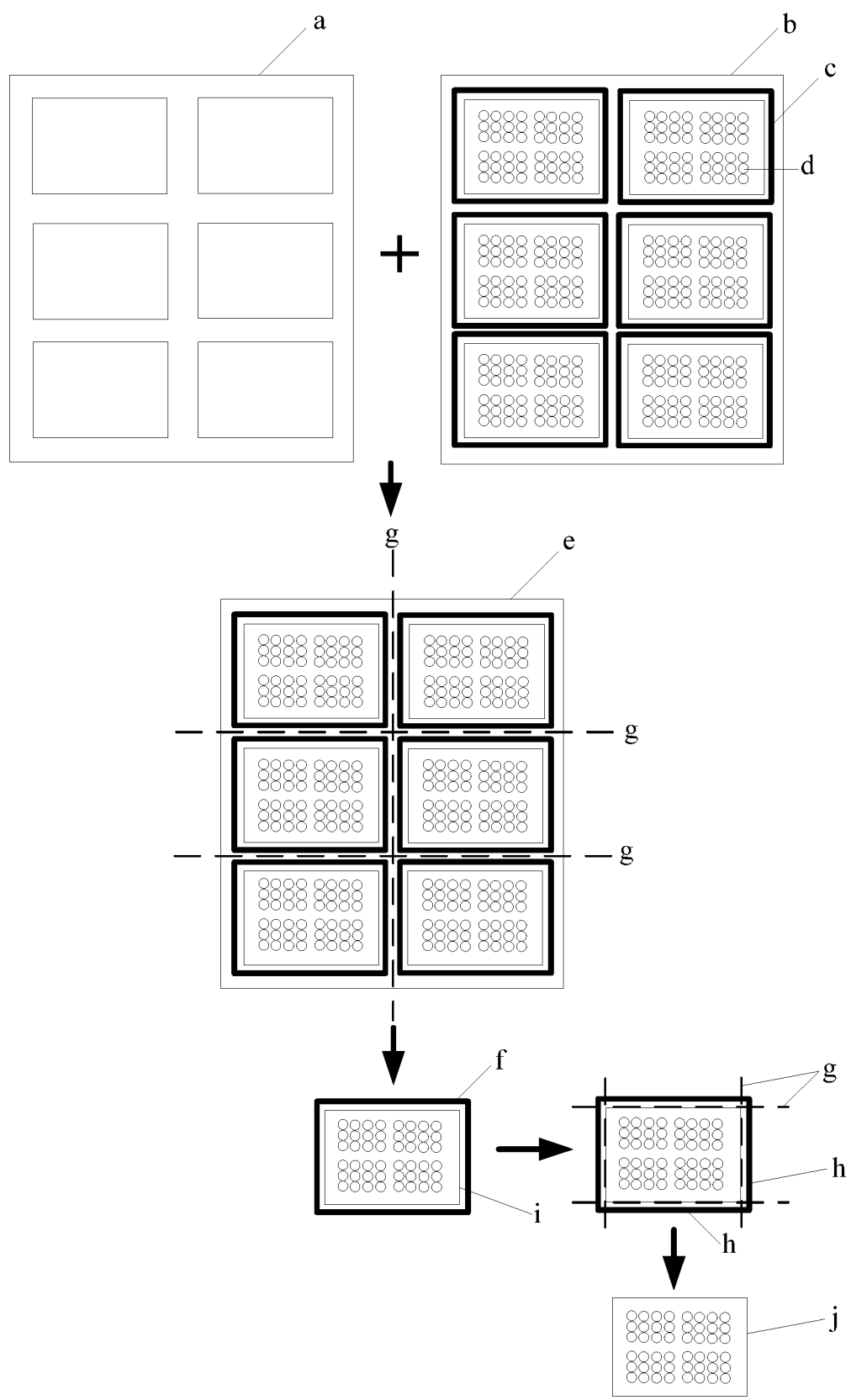
FIG. 4 is a schematic view of a method for preparing a component packaging structure provided by an embodiment of the present disclosure.

In order to make the above objects, features and advantages of the present disclosure more obvious and understandable, the present disclosure will be described in further detail below with reference to the accompanying drawings and specific embodiments.

In the description of the present disclosure, unless otherwise specified, the meaning of "plurality" is two or more. The terms "upper," "lower," "left," "right," "inner," "outer," and the like indicate an orientation or positional relationship that is based on the orientation or positional relationship shown in the drawings. They are only for convenience in describing the present disclosure and simplifying the description, and are not intended to indicate or imply that the machine or element referred to must have a particular orientation, be constructed and operated in a particular orientation, and therefore should not be understood as limiting the present disclosure.

In the description of the present disclosure, it should be noted that unless otherwise specified and limited, the terms "installed", "connected" and "coupled" should be understood broadly. For example, it may be fixed connection, detachable connection, or integral connection. It can be a mechanical connection or an electrical connection. It can be directly connected or indirectly connected through an intermediate medium. For those of ordinary skill in the art, the specific meaning of the above-mentioned terms in this disclosure can be understood according to the specific situation.

Specific embodiments of the present disclosure will be described in further detail below with reference to the drawings and embodiments. The following examples are intended to illustrate the present disclosure but are not intended to limit the scope of the disclosure.

A method for packaging an optical device or component, such as an optical sensor, includes the following steps: using a packaging structure made of dummy glass, wherein the packaging structure is directly bond to the optical sensor; and protecting the elements of the optical sensor between the sensor substrate and the packaging structure.

Although the above-mentioned packaging structure plays a certain protective role, directly bonding the packaging structure made of dummy glass to the optical sensor may cause some damage to the elements of the optical sensor. And when the packaging structure is to be removed so as to use the optical sensor, the dummy glass is not easy to separate from the sensor substrate, and the separation process of the dummy glass will further damage the sensor substrate and elements.

Therefore, the inventors of the present disclosure have further provided an improved method for packaging a device or component.

According to one exemplary embodiment of the present disclosure, there is provided a packaging unit. When the packaging unit is used to package a component, the packaging unit in the formed component packaging structure will not cause damage to the base substrate and parts of the component, the packaging substrate is easy to separate from the base substrate, and the separation process of the packaging substrate will not cause damage to the base substrate and parts of the component.

FIG. 1 is a schematic structural view of a packaging unit provided by an embodiment of the present disclosure. The packaging unit shown in FIG. 1 includes a bonding substrate 1 and spacer(s) 2 formed on the bonding substrate 1 through a patterning process, and the bonding substrate 1 is reserved with package regions 3 for applying sealant. The patterning process is also called patterning method, including photolithography, surface mount method (SMT) or printing method, etc.

The component to be packaged generally includes a base substrate 4 and parts or elements 5 formed on the base substrate 4. The component structure is as shown in FIG. 2. During assembly or transportation, because the elements of the component are easily damaged, the packaging unit is often used to package the component.

When packaging a component using the packaging unit provided by the embodiment of the present disclosure, since the spacer(s) 2 is arranged on the bonding substrate 1 of the packaging unit, the spacer(s) 2 is supported between the bonding substrate 1 and the base substrate 4 for the component, thus avoiding the damage caused by the bonding substrate 1 to the base substrate 4 and the elements 5 on the base substrate 4, as well as the hard contact between the bonding substrate 1 and the base substrate 4, therefore ensuring the safety of the component. As for the component packaging structure formed after packaging the packaging unit and the component, since the packaging unit is provided with the spacer(s) 2, the packaging unit is easy to separate from the surface of the component, and the separation operation of the packaging unit does not cause damage to the component.

The spacer 2 may be elastic material such as resin. The spacer 2 can also be made of flexible or soft materials, as long as the stiffness of the spacer 2 is less than that of the base substrate 4 and the elements 5 on the base substrate 4, and the flexibility is greater than that of the base substrate 4 and the elements 5 on the base substrate 4, so as not to cause unnecessary damage to the elements 5 during packaging. The number of spacer(s) 2 may be multiple, the heights of the plurality of spacers 2 may be the same or different, and may be set according to the structure of the component to be packaged. The plurality of spacers 2 may be formed by a single patterning process or may be formed by multiple patterning processes. The spacer 2 may have various shapes, such as a cylinder, a cuboid or a cube, etc. The number and height of the spacers 2, the arrangement of the plurality of spacers, and the like can be designed according to the actual situation.

The bonding substrate 1 of the packaging unit provided by the embodiment of the present disclosure is provided with packaging regions 3 for applying sealant. When the packaging unit is used to package a component, the sealant can be applied in the packaging regions 3 of the bonding substrate 1 to realize the packaging of the packaging unit and the component.

The position of the packaging region 3 on the bonding substrate 1 can be set according to actual needs. For example, the packaging region 3 can be set on the periphery of the surface of the bonding substrate 1 where the spacer(s) 2 is formed, and can be set on the side wall of the bonding substrate 1. The packaging regions 3 on the bonding substrate 1 may be continuous or discrete regions. Correspondingly, the sealant layer formed at the packaging region 3 may be closed or non-closed, i.e., open or discrete.

The packaging unit provided by the embodiment of the present disclosure may further include one or more alignment marks formed on the bonding substrate 1 through patterning process. Correspondingly, the base substrate of the component is also provided with one or more alignment marks. When the component is packaged using the packaging unit, the alignment marks on the bonding substrate 1 and the alignment marks on the base substrate can be aligned, and then the packaging unit is placed on the component according to the aligned positions. The arrangement of the alignment marks facilitates the packaging operation of the packaging unit and improves the packaging efficiency. The alignment marks and spacer(s) 2 on the bonding substrate 1 can be formed by a single patterning process or by multiple patterning processes, and can be operated according to actual situations.

Compared with the prior art, the packaging unit provided by the embodiment of the present disclosure includes a bonding substrate and spacer(s) formed on the bonding substrate through patterning process, wherein the bonding substrate is reserved with packaging regions. When the packaging unit is used to package a component, since the spacer(s) is supported between the bonding substrate and the base substrate, the packaging unit is easy to separate or remove from the base substrate. At the same time, the packaging unit has little or no damage to the base substrate and the elements formed on the base substrate, thus effectively protecting the performance of the base substrate and the elements on the base substrate.

When the component is separated from the component packaging structure, the component packaging structure can be cut first, the cutting line is positioned inwards of the packaging line of the component packaging structure, and then the cut packaging unit is separated. In particular, the separation can be carried out by using tools such as a suction ball or a bamboo stick, and the component for final use is obtained. The separation method of the packaging unit has no damage or less damage to the component, thus effectively protecting the component performance.

The embodiment of the present disclosure also provides a component packaging structure. The component packaging structure includes a packaging unit and a component provided by the embodiment of the present disclosure, wherein the packaging unit and the component are aligned with each other. Based on the structure of the packaging unit, the spacer(s) is supported between the bonding substrate of the packaging unit and the base substrate of the component, the bonding substrate and the base substrate are packaged by sealant applied in the packaging regions of the bonding substrate, and the elements/parts of the component are packaged between the bonding substrate and the base substrate.

Since the spacer(s) is supported between the bonding substrate and the base substrate, the packaging unit is easy to separate from the base substrate. At the same time, the packaging unit has little or no damage to the base substrate and the elements formed on the base substrate, effectively protecting the performance of the base substrate and the elements on the base substrate.

When obtaining the component from the component packaging structure, the component packaging structure needs to be cut to remove the sealant layer in the component packaging structure to obtain the component to be used. Since the component packaging structure is subsequently cut, i.e., the bonding substrate and the base substrate are cut, the size of the base substrate to be packaged before packaging the component is larger than the size of the base substrate when it is finally used. Afterwards, the cut packaging unit can be separated, and in particular, tools such as a suction ball or a bamboo stick can be used to finally get the component for use. The separation method of the packaging unit has no damage or less damage to the component, thus effectively protecting the component performance.

The embodiment of the present disclosure also provides a preparation method of the component packaging structure. FIG. 3 is a flowchart of a method for preparing a component packaging structure provided by an embodiment of the present disclosure. The method for preparing the component packaging structure shown in FIG. 3 includes:

Step 101: aligning the packaging unit with the component, wherein the bonding substrate of the packaging unit and the base substrate of the component are supported by spacer(s).

The packaging unit provided by the embodiment of the present disclosure includes a bonding substrate and spacer(s) formed on the bonding substrate. When the packaging unit is used to package a component, the packaging unit and the component are aligned. The spacer(s) on the packaging unit is clamped between the bonding substrate of the packaging unit and the base substrate of the component, and the element/part of the component is positioned between the bonding substrate and the base substrate.

In order to facilitate the packaging of the packaging unit and the component, one or more first alignment marks can be arranged on the bonding substrate of the packaging unit, and one or more second alignment marks can be correspondingly arranged on the base substrate of the component. Therefore, the step of aligning the packaging unit and the component can include: aligning the first alignment marks on the bonding substrate with the second alignment marks on the base substrate, and placing the packaging unit on the base substrate according to the determined aligned positions, thus realizing accurate and rapid packaging of the packaging unit and the component.

In actual operation, multiple components can share the same base substrate, i.e. multiple elements/parts of multiple components are arranged at different positions of the same base substrate. When performing component packaging operations, multiple packaging units need to be packaged on the same base substrate. Alternatively, multiple packaging units may share a same bonding substrate, i.e., multiple spacers of multiple packaging units may be arranged at different positions of the same bonding substrate, and the same bonding substrate may be relatively placed on the same base substrate during component packaging operations.

Step 102: packaging the bonding substrate and the base substrate for assembly or transportation.

In order to prevent the elements of the component from being damaged, it is necessary to package the bonding substrate of the packaging unit and the base substrate of the component. The packaging process can be carried out using packaging adhesive.

The bonding substrate of the packaging unit is reserved with packaging regions, and sealant can be applied to the packaging regions of the bonding substrate first. After the packaging unit and the component are aligned, the sealant applied to the packaging regions of the bonding substrate is also pushed onto the base substrate, thus completing the packaging operation. Alternatively, after the alignment of the packaging unit and the component is completed, it is necessary to further apply sealant (i.e., patch adhesive) on the outer periphery of one side of the base substrate or on the outer periphery of the region between the bonding substrate and the base substrate so that the packaging unit and the component can be firmly packaged.

When a plurality of components share a same base substrate, the method may further include cutting the same base substrate to obtain a plurality of individual component packaging structures after the packaging operation is completed through the packaging step. After cutting to obtain a plurality of individual component packaging structures, the component packaging structures are assembled or transported.

After the transportation is completed, when the component is to be used, the individual component packaging structure needs to be cut again to obtain the component for final use. The method for obtaining the component for final use from the component packaging structure may include cutting the component packaging structure, wherein the cutting line is positioned inwards of the packaging line of the component packaging structure, and separating the cut packaging unit to obtain the component for final use. The substrate can be cut by laser, or glass cutter, etc. Since the component has undergone the process of packaging, cutting to remove the package, the size of the base substrate to be packaged should be larger than that of the base substrate for final use, so as to ensure the normal use of the component after removing the sealant.

The step of separating the cut packaging unit can be realized in a variety of ways, such as using a suction ball or a bamboo stick to separate the cut packaging unit from the component. The separation operation can be performed manually or by machine automatically. The packaging method and the unpacking method of the packaging unit have no damage or less damage to the component and effectively protect the performance of the component.

In order to enable those skilled in the art to understand the present disclosure more clearly, the using process of the packaging unit provided by an embodiment of the present disclosure will now be described in further detail with reference to FIG. 4.

In FIG. 4, six components share the same first base substrate a and the elements of the six components are located at different positions of the first base substrate a, the six packaging units share the same second bonding substrate b and the spacers of the six packaging units are located at different positions of the second bonding substrate b, and the packaging regions c for applying the sealant are respectively arranged on the second bonding substrate b at certain distances from the periphery of each spacer.

When the packaging unit is used to package components, the second bonding substrate b is arranged on the first base substrate a in alignment, the spacers d are supported between the second bonding substrate b and the first base substrate a, and the sealant applied on the second bonding substrate b at each packaging region c around each spacer d is adhered and fixed with the first base substrate a to form a pair of aligned substrates e, wherein the pair of aligned substrates e includes six component packaging structures. After that, the aligned substrates e are cut to obtain six individual component packaging structures f, which are convenient for subsequent assembly or transportation.

In use, it is necessary to obtain the component for final use from the component packaging structure f. Since the sealant is formed around the component packaging structure f, it is necessary to re-cut the component packaging structure. When cutting the component packaging structure f, the cutting line g should be located inwards of the packaging line h in the component packaging structure f. The packaging line h is formed by the sealant. When removing the sealant, it is necessary to ensure that the component is intact.

In FIG. 4, the inner side of the packaging region c of the bonding substrate is provided with a line frame mark i. The size of the area enclosed by the line frame mark i corresponds to the size of the base substrate when the component is used. When cutting the component packaging structure, the substrate can be cut according to the line frame mark i to obtain the required component j. The provision of the line frame mark i facilitates the substrate cutting operation.

After the sealant is cut, the packaging unit on the component is peeled off by using a suction ball or a bamboo stick, and the peeling operation does not damage the component j, thus obtaining the intact component j for final use.

Using the method provided by the embodiment of the present disclosure to package the component can ensure the safety of the component during transportation or assembly, can conveniently unpack the component packaging structure, can operate simply and conveniently, does not damage the component, and ensures the yield of the component. Besides, the method is simple to implement and has low cost. The method described in the embodiment of the present disclosure can be used to package and unpack components with high precision, such as precision components used the medical field, thus ensuring the safety of the components.

The present disclosure provides a packaging unit, a component packaging structure and a preparation method thereof. The packaging unit provided by the present disclosure includes a bonding substrate and spacers formed on the bonding substrate through patterning process, wherein the bonding substrate is reserved with packaging regions for applying sealant. When the packaging unit is used to package a component, since the spacer(s) is supported between the bonding substrate and the base substrate, the packaging unit is easy to separate from the base substrate, and at the same time, the packaging unit has little or no damage to the base substrate and the elements formed on the base substrate, thus effectively protecting the performance of the base substrate and the elements on the base substrate.

When the component is separated from the component packaging structure, the component packaging structure can be cut first, the cutting line is positioned inwards of the packaging line in the component packaging structure, and then the cut packaging unit can be separated. In particular, tools such as a suction ball or a bamboo stick can be used to finally obtain the component for use. The separation method of the packaging unit has no damage or less damage to the component, thus effectively protecting the performance of the component.

The packaging unit, the component packaging structure and the preparation method provided by the present disclosure are described in detail above. In this context, a specific example is used to explain the principle and implementation of the present disclosure. The above description of the embodiment is only used to help understand the method and core idea of the present disclosure. At the same time, for those skilled in the art, according to the idea of this disclosure, there will be changes in the specific implementation and application scope. In summary, the content of this specification should not be construed as limitations on this disclosure.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

The system, apparatus and devices herein are amongst others described during operation. As will be clear to the person skilled in the art, the disclosure is not limited to methods of operation or devices in operation.

It should be noted that the above-mentioned embodiments illustrate rather than limit the disclosure, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The disclosure may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The disclosure further applies to a device including one or more of the characterizing features described in the description and/or shown in the bonded drawings. The disclosure further pertains to a method or process including one or more of the characterizing features described in the description and/or shown in the bonded drawings.

The various exemplary embodiments discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A packaging unit, comprising:
   a bonding substrate;
   a plurality of spacers having different heights and formed on the bonding substrate through a spacer forming patterning process; and
   an alignment mark formed on the bonding substrate through an alignment mark forming patterning process,
   wherein the bonding substrate is reserved with packaging regions for applying a sealant, the packaging regions are set on side walls of the bonding substrate.

2. The packaging unit according to claim 1, wherein each of the plurality of spacers is a cylinder, cuboid, or cube.

3. A component packaging structure, wherein the component packaging structure comprises a base substrate, a component arranged on the base substrate and a packaging unit, wherein the packaging unit comprises: a bonding substrate; a plurality of spacers having different heights and formed on the bonding substrate through a spacer forming patterning process; and an alignment mark formed on the bonding substrate through an alignment mark forming patterning process, wherein the bonding substrate is reserved with packaging regions for applying a sealant, the packaging regions are set on side walls of the bonding substrate, wherein the packaging unit and the component are aligned with each other, and
   wherein the plurality of spacers are supported between the bonding substrate of the packaging unit and the base substrate of the component, the bonding substrate and the base substrate are packaged by applying the sealant in the packaging regions, and elements of the component are packaged between the bonding substrate and the base substrate.

4. A method for manufacturing the component packaging structure according to claim 3, comprising:
   aligning the packaging unit with the component, wherein the bonding substrate of the packaging unit and the base substrate of the component are supported by the plurality of spacers; and
   packaging the bonding substrate and the base substrate for assembly or transportation.

5. The method according to claim 4, wherein a plurality of components share the base substrate, the method further comprising:
   cutting the base substrate to obtain a plurality of individual component packaging structures.

6. The method according to claim 5, further comprising:
   re-cutting each of the individual component packaging structures, wherein a cutting line is positioned inwards of a packaging line of the individual component packaging structures; and
   separating cut packaging units to obtain the components for final use.

7. The method according to claim 6, wherein separating the cut packaging units comprises:
   separating the cut packaging units from the component by using a suction ball or a bamboo stick.

8. The method according to claim 4, wherein the bonding substrate is provided with a first alignment mark and the base substrate is provided with a second alignment mark;
   wherein aligning the packaging unit with the component comprises:
   aligning the first alignment mark of the bonding substrate with the second alignment mark of the base substrate; and
   placing the packaging unit on the base substrate according to determined aligned positions.

9. The component packaging structure according to claim 3, wherein each of the plurality of spacers is a cylinder, cuboid, or cube.

* * * * *